US009673782B1

(12) United States Patent
Andrabi et al.

(10) Patent No.: US 9,673,782 B1
(45) Date of Patent: Jun. 6, 2017

(54) CENTER FREQUENCY AND Q TUNING OF BIQUAD FILTER BY AMPLITUDE-LIMITED OSCILLATION-BASED CALIBRATION

(71) Applicant: QUALCOMM Incorporated, San Diego, CA (US)

(72) Inventors: Shuja Andrabi, Bangalore (IN); Rahul Karmaker, Bangalore (IN)

(73) Assignee: QUALCOMM Inc., San Diego, CA (US)

( * ) Notice: Subject to any disclaimer, the term of this patent is extended or adjusted under 35 U.S.C. 154(b) by 0 days.

(21) Appl. No.: 15/238,176

(22) Filed: Aug. 16, 2016

(51) Int. Cl.
*H02K 5/00* (2006.01)
*H03H 11/04* (2006.01)
*H03H 11/12* (2006.01)
*H04L 27/00* (2006.01)

(52) U.S. Cl.
CPC ... *H03H 11/1217* (2013.01); *H03H 2210/017* (2013.01); *H03H 2210/025* (2013.01); *H03H 2210/028* (2013.01); *H04L 27/0002* (2013.01)

(58) Field of Classification Search
CPC .............. H03H 11/0422; H03H 11/04; H03H 11/1291; H03H 11/1213; H03H 11/1217; H03L 27/0002; H03K 5/1252
USPC .................. 327/551–559, 336–337
See application file for complete search history.

(56) References Cited

U.S. PATENT DOCUMENTS

| 7,692,484 B2 | 4/2010 | Terryn et al. |
| 8,816,761 B2 | 8/2014 | Bailey et al. |
| 8,872,684 B2 * | 10/2014 | Matsukawa ........ H03H 11/0433 341/120 |
| 2008/0007443 A1 * | 1/2008 | Inose ........................ H03F 1/34 341/158 |

OTHER PUBLICATIONS

Jurisic D., et al., "Tuning Elliptic Filters with a 'Tuning Biquad'," International Symposium on Circuits and Systems (ISCAS), 2009, pp. 45-48.
Singh S.V., et al., "Current-Mode Electronically Tunable Biquad Filter," International Conference on Multimedia, Signal Processing and Communication Technologies, 2011, pp. 176-179.
Tomar R.S., et al., "Fully Integrated Electronically Tunable Universal Biquad Filter operating in Current-Mode," International Conference on Signal Processing and Integrated Networks (SPIN), 2014, pp. 549-554.

* cited by examiner

*Primary Examiner* — Dinh T Le
(74) *Attorney, Agent, or Firm* — Patterson & Sheridan, L.L.P.

(57) ABSTRACT

Certain aspects of the present disclosure provide methods and apparatus for calibrating a tunable active filter. One example apparatus is a filter circuit that generally includes a tunable active filter comprising at least one amplifier and a first feedback path coupled between an input and an output of the at least one amplifier, the first feedback path comprising at least one switch; and an amplitude limiter coupled to the tunable active filter and comprising at least one transistor disposed in a second feedback path coupled between the input and the output of the at least one amplifier.

21 Claims, 12 Drawing Sheets

US 9,673,782 B1

CENTER FREQUENCY AND Q TUNING OF BIQUAD FILTER BY AMPLITUDE-LIMITED OSCILLATION-BASED CALIBRATION

TECHNICAL FIELD

Certain aspects of the present disclosure generally relate to electronic circuits and, more particularly, to calibrating a tunable active filter.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and/or BSs may include a tunable active filter used, for example as a baseband filter in a receive chain or a transmit chain. The tunable active filter may be tuned to vary the center frequency ($f_0$) of the filter over a range of frequencies. For high quality factor (Q) and high $f_0$ filters, the Q and $f_0$ may vary due to process variations, mismatch, and limited operational amplifier (op amp) unity gain bandwidth (UGB). Therefore, it may be desirable to calibrate the tunable active filter.

SUMMARY

Certain aspects of the present disclosure generally relate to methods and apparatus for calibrating a tunable active filter. For certain aspects, an amplitude-limiting circuit may be coupled to the tunable active filter to limit the amplitude of an oscillating signal when the tunable active filter is operating in an oscillation mode.

Certain aspects of the present disclosure provide a filter circuit. The filter circuit generally includes a tunable active filter comprising at least one amplifier and a first feedback path coupled between an input and an output of the at least one amplifier, the first feedback path comprising at least one switch; and an amplitude limiter coupled to the tunable active filter and comprising at least one transistor disposed in a second feedback path coupled between the input and the output of the at least one amplifier.

According to certain aspects, the tunable active filter is configured to generate an oscillating signal when the at least one switch is open. For certain aspects, the amplitude limiter is configured to limit the amplitude of the oscillating signal generated by the tunable active filter.

According to certain aspects, the tunable active filter comprises a Tow-Thomas biquad filter.

According to certain aspects, the at least one transistor of the amplitude limiter comprises an n-channel metal-oxide semiconductor (NMOS) transistor and a p-channel metal-oxide semiconductor (PMOS) transistor, a drain of the NMOS transistor is coupled to a drain of the PMOS transistor, and a source of the NMOS transistor is coupled to a source of the PMOS transistor. For certain aspects, the amplitude limiter further comprises a biasing circuit coupled to a gate of the NMOS transistor and to a gate of the PMOS transistor, the biasing circuit being configured to generate a first bias voltage for biasing the gate of the NMOS transistor and a second bias voltage for biasing the gate of the PMOS transistor. For certain aspects, the biasing circuit includes a buffer circuit having an input configured to receive a common-mode voltage of the filter circuit; a first current source and a first resistive element connected in series, coupled to an output of the buffer circuit, and configured to generate the first bias voltage; and a second current source and a second resistive element connected in series, coupled to the output of the buffer circuit, and configured to generate the second bias voltage. At least one of the first resistive element or the second resistive element may include a programmable resistor. For certain aspects, the amplitude limiter further includes a first switch coupled between the gate of the NMOS transistor and a first node between the first current source and the first resistive element, the first switch being configured to selectively couple the gate of the NMOS transistor to the first node to receive the first bias voltage; and a second switch coupled between the gate of the PMOS transistor and a second node between the second current source and the second resistive element, the second switch being configured to selectively couple the gate of the PMOS transistor to the second node to receive the second bias voltage. For certain aspects, the amplitude limiter further includes a third switch coupled between the gate of the NMOS transistor and a first voltage rail and configured to selectively couple the gate of the NMOS transistor to the first voltage rail; and a fourth switch coupled between the gate of the PMOS transistor and a second voltage rail and configured to selectively couple the gate of the PMOS transistor to the second voltage rail.

According to certain aspects, the tunable active filter further includes at least one programmable capacitor coupled between the input and the output of the at least one amplifier for tuning a center frequency of the filter circuit; and at least one programmable resistor coupled between the input and the output of the at least one amplifier for tuning a quality factor of the filter circuit. For certain aspects, the at least one programmable resistor is connected in series with the at least one switch. For certain aspects, the at least one programmable capacitor is disposed in a third feedback path coupled between the input and the output of the at least one amplifier.

According to certain aspects, the tunable active filter comprises a differential tunable active filter having at least one differential amplifier with first and second inputs and first and second outputs; the amplitude limiter comprises first and second amplitude-limiting circuits; the first amplitude-limiting circuit is coupled between the first input and the first output of the at least one differential amplifier; and the second amplitude-limiting circuit is coupled between the second input and the second output of the at least one differential amplifier.

Certain aspects of the present disclosure provide a method for calibrating a tunable active filter. The method generally includes generating an oscillating signal with the tunable active filter; adjusting a value of a component in the tunable active filter until a frequency of the oscillating signal substantially matches a desired center frequency for the tunable active filter; calculating a phase shift of an amplifier in the tunable active filter based on an initially calibrated center frequency for the tunable active filter, an initially calibrated quality factor associated with the initially calibrated center frequency, and a unity gain bandwidth of the amplifier associated with the initially calibrated center frequency and the initially calibrated quality factor; and adjusting another value of another component in the tunable active filter based on the calculated phase shift to adjust a quality factor of the tunable active filter at the desired center frequency.

Certain aspects of the present disclosure provide a method for calibrating a tunable active filter comprising at least one amplifier. The method generally includes generating an oscillating signal with the tunable active filter by opening at least one first switch in a first feedback path coupled between an input and an output of the at least one amplifier; and limiting the amplitude of the oscillating signal generated by the tunable active filter.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
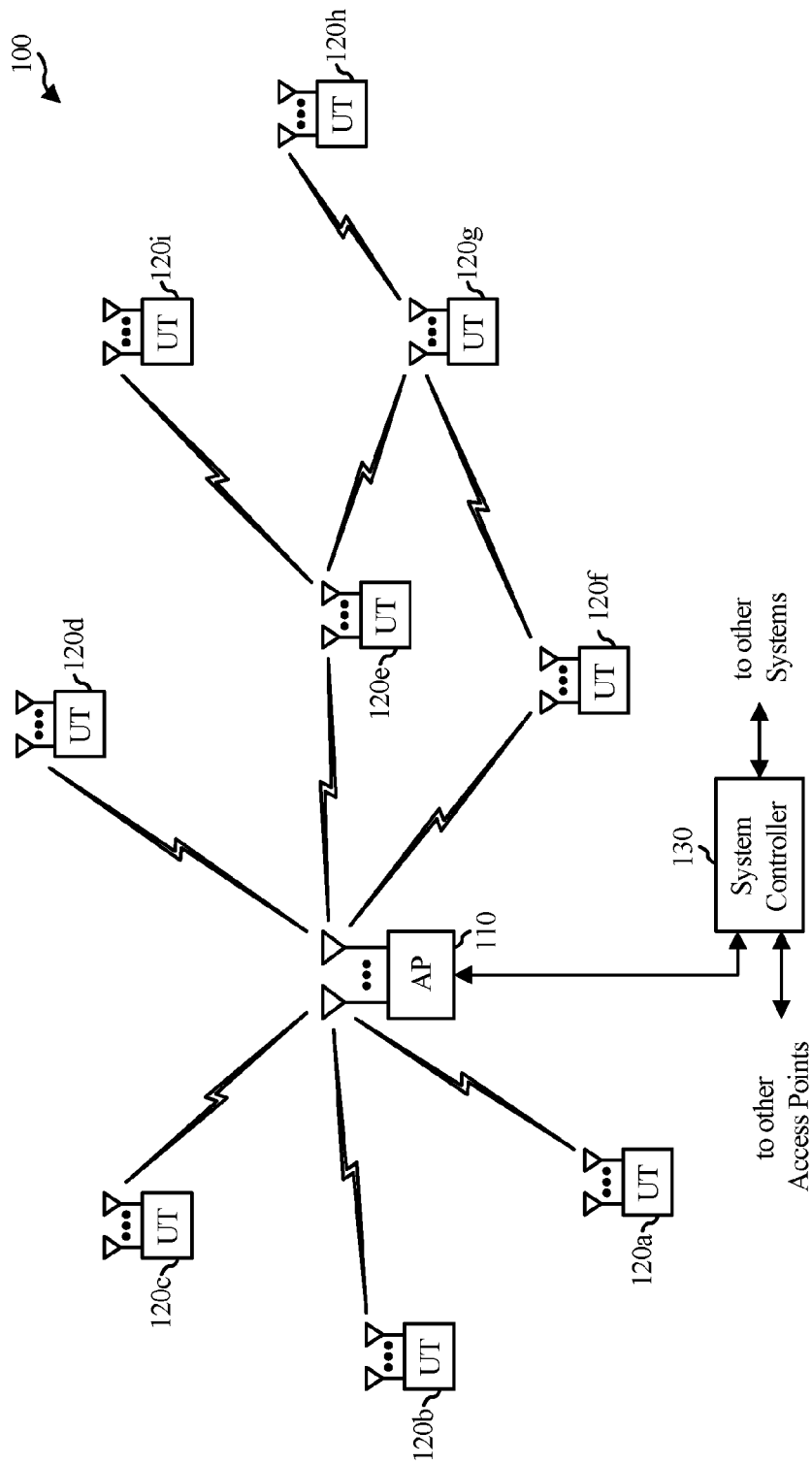
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include at least one tunable active filter. The tunable active filter may include an amplitude-limiting circuit and may be calibrated as described below.

Figure 2:
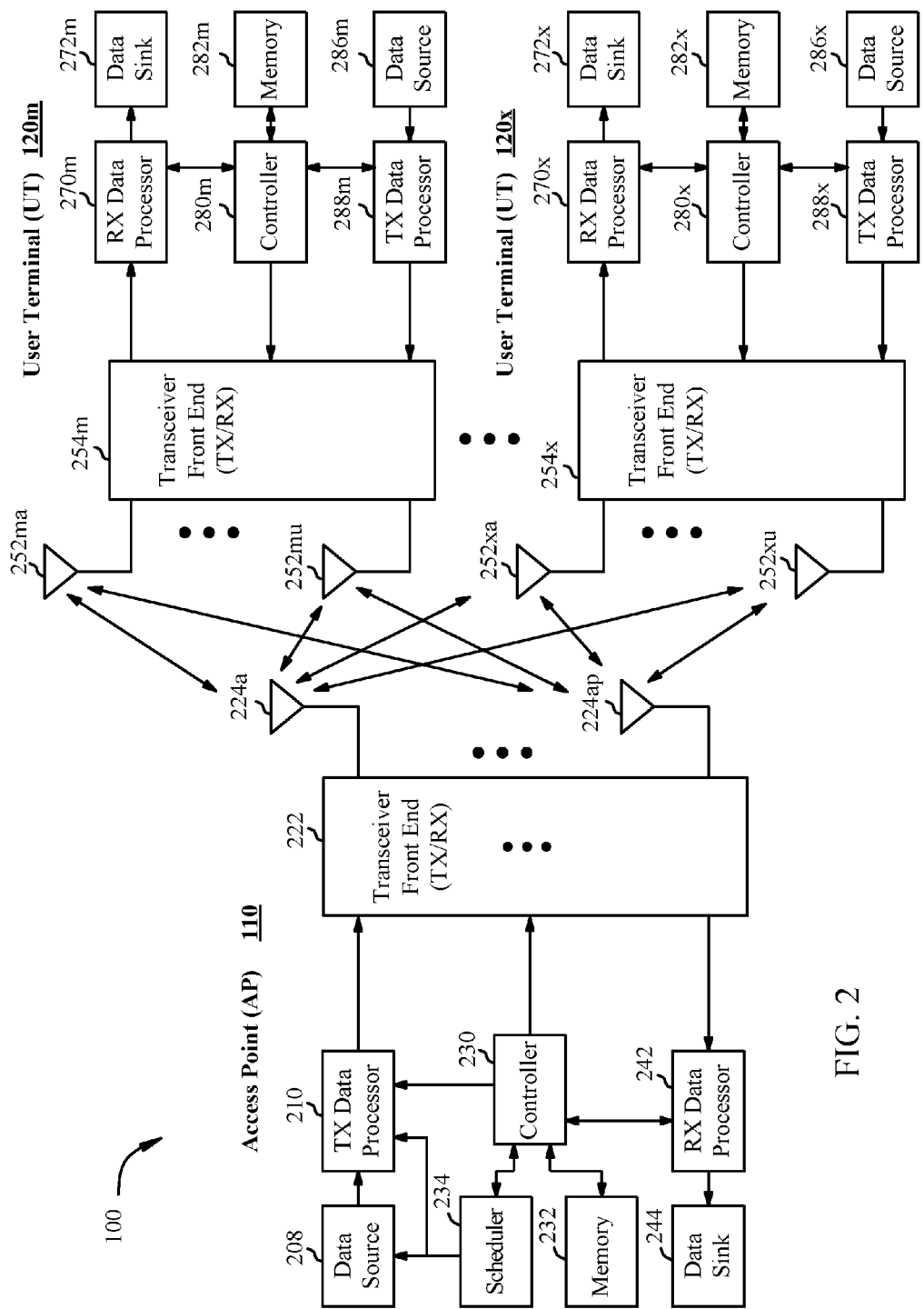
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include a tunable active filter. The tunable active filter may include an amplitude-limiting circuit and may be calibrated as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
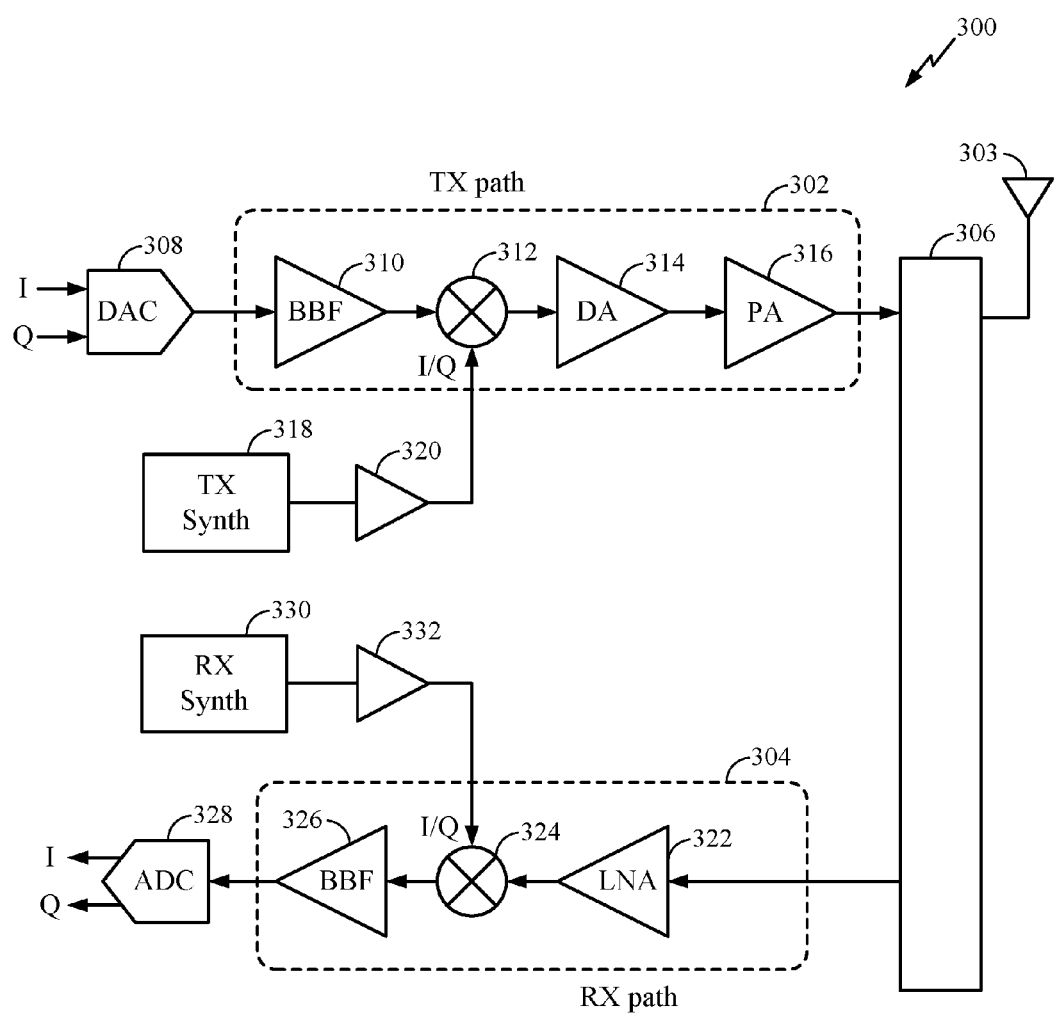
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. In some aspects of the present disclosure, the BBF 310 may include a tunable active filter as described below. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the BBF 326 may include a tunable active filter as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Center Frequency and Q Tuning

There are many different circuit topologies for implementing filters in electronic circuits, such as a baseband filter (e.g., BBF 310 or 326) in a receive chain or a transmit chain of a radio frequency front-end. One example filter topology using one or more amplifiers (i.e., an active topology) is referred to as a biquadratic (or biquad) filter. A biquad filter is a type of linear filter for implementing a transfer function that is the ratio of two quadratic functions, hence the name "biquadratic." One example is the Tow-Thomas biquad filter, which is implemented with a two-integrator loop topology and can be used as either a low-pass or a bandpass filter.

Figure 4:
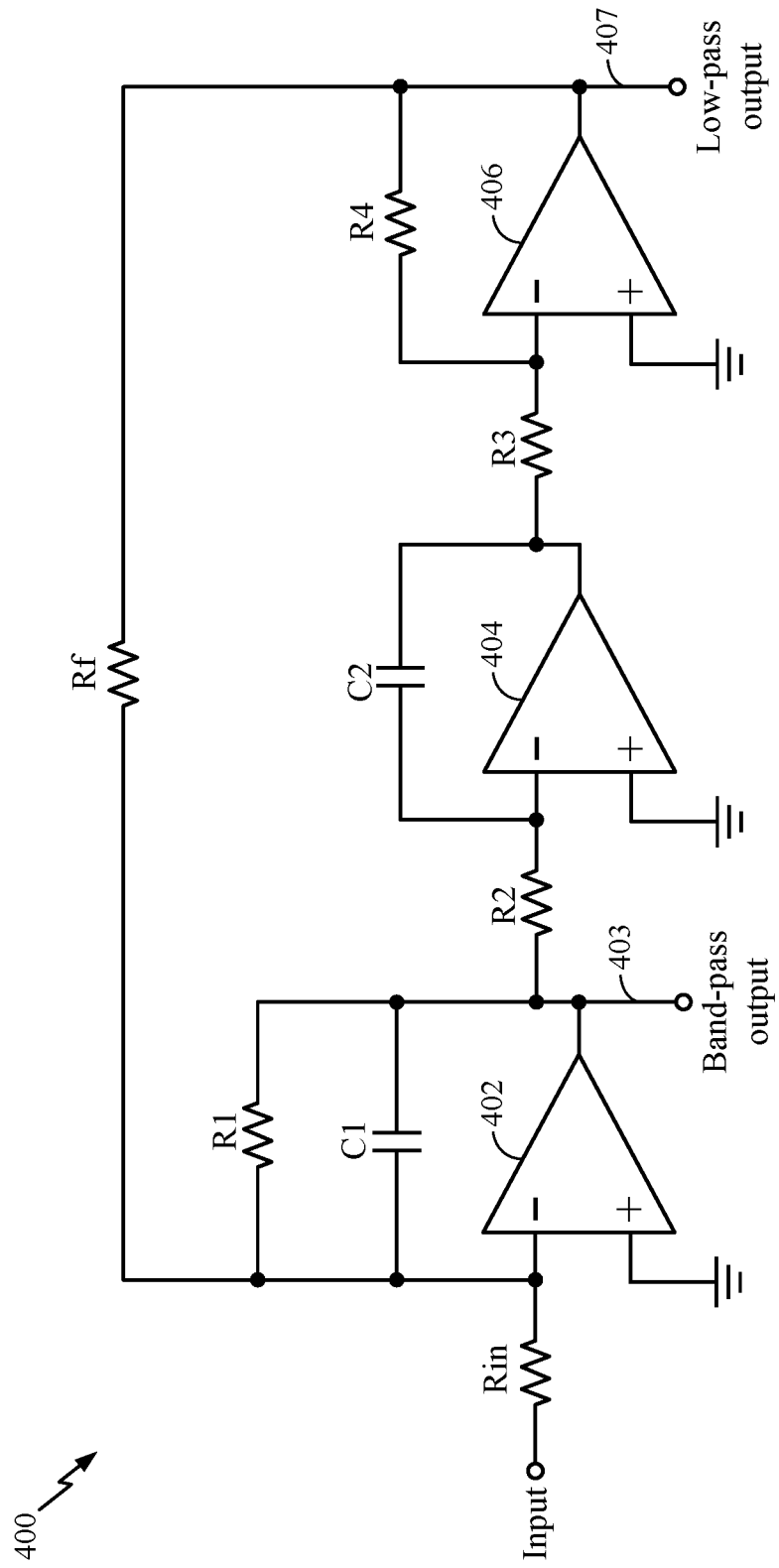
FIG. 4 is a schematic diagram of an example Tow-Thomas biquad filter circuit topology, in accordance with certain aspects of the present disclosure.

FIG. 4 is a schematic diagram of an example biquad filter 400, in accordance with certain aspects of the present disclosure. In one implementation, the biquad filter 400 may comprise a Tow-Thomas biquad filter. The biquad filter 400 includes three amplifiers 402, 404, 406, which may be implemented with operational amplifiers (op amps). The positive inputs of all three amplifiers may be connected with a reference potential (e.g., electrical ground as shown). Resistor R1 and capacitor C1 are connected in parallel in a feedback loop, connecting the output 403 of amplifier 402 with its negative input. Amplifier 402, resistors Rin and R1, and capacitor C1 form the first integrator in the biquad filter 400, and the output 403 of the amplifier 402 can be used as the output of a bandpass filter implemented with the biquad filter. Amplifier 404, resistor R2, and capacitor C2 form the second integrator in the two-integrator loop topology. Amplifier 406 is used in an inverting amplifier circuit with resistors R3 and R4, where resistor R4 is in a feedback loop connecting the output 407 of the amplifier 406 with its negative input. The output 407 of amplifier 406 can be used as the output of a low-pass filter implemented with the biquad filter 400. Resistor Rf is connected in a feedback loop connecting the output 407 of amplifier 406 to the negative input of amplifier 402.

The natural frequency ($f_0$) of the biquad filter 400 is $$f_0 = \frac{1}{2\pi\sqrt{Rf*R2*C1*C2}}$$

The quality factor (Q) for the biquad filter 400 can be expressed as $$Q = R1 * \sqrt{\frac{C1}{C2*Rf*R2}}$$

Figure 5:
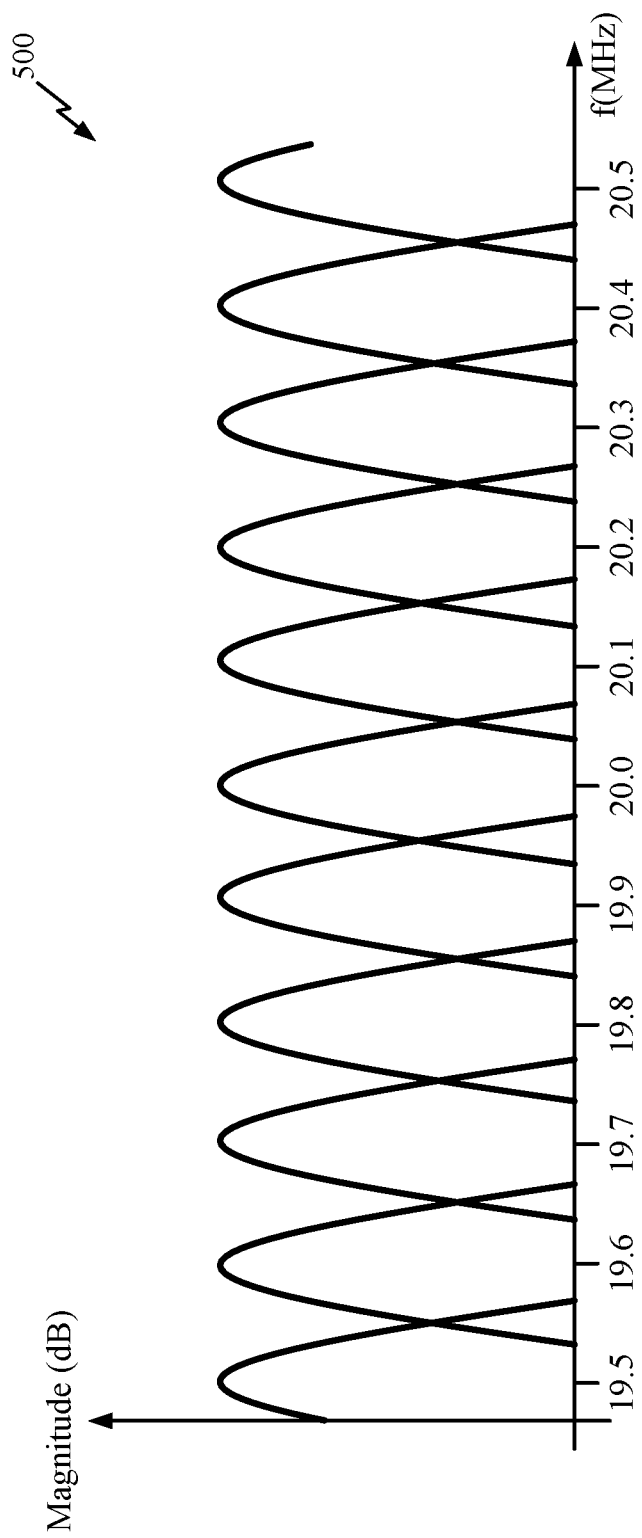
FIG. 5 is a magnitude plot of different filter responses at different center frequencies of a tunable active filter, in accordance with certain aspects of the present disclosure.

By making one or more components in the biquad filter 400 programmable, the biquad filter can be used as a tunable filter. FIG. 5 is an example magnitude plot 500 of different bandpass filter responses at different center frequencies of a tunable active filter, such as the biquad filter 400, in accordance with certain aspects of the present disclosure. For example, a tunable filter may be used to provide bandpass filter responses with center frequencies every 100 kHz in a frequency range of 9.5 MHz to 42.5 MHz.

Figure 6A:
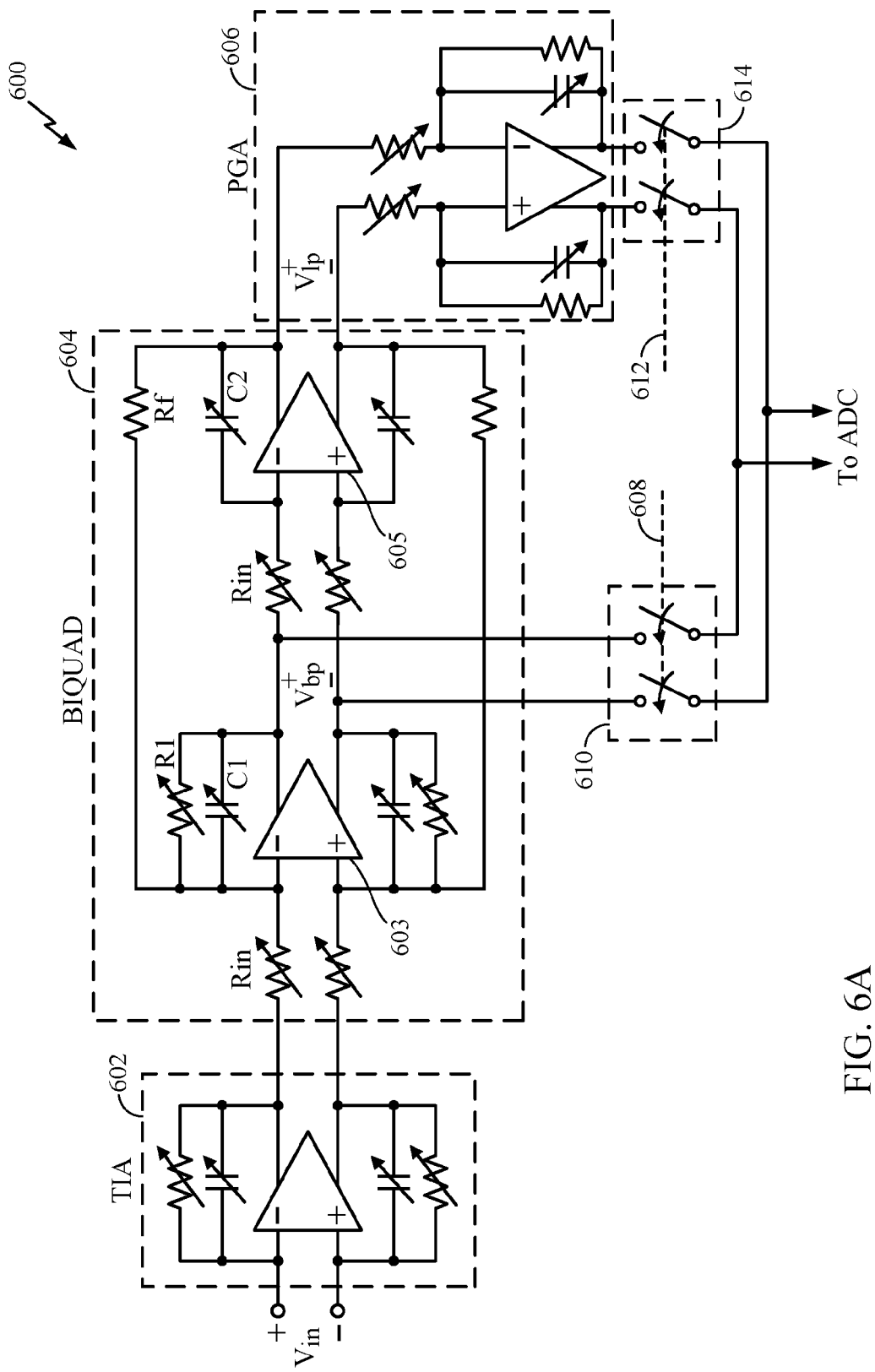
FIG. 6A is a schematic diagram of an example receive path with a transimpedance amplifier, a biquad filter, and a programmable gain amplifier, in accordance with certain aspects of the present disclosure.
Figure 6B:
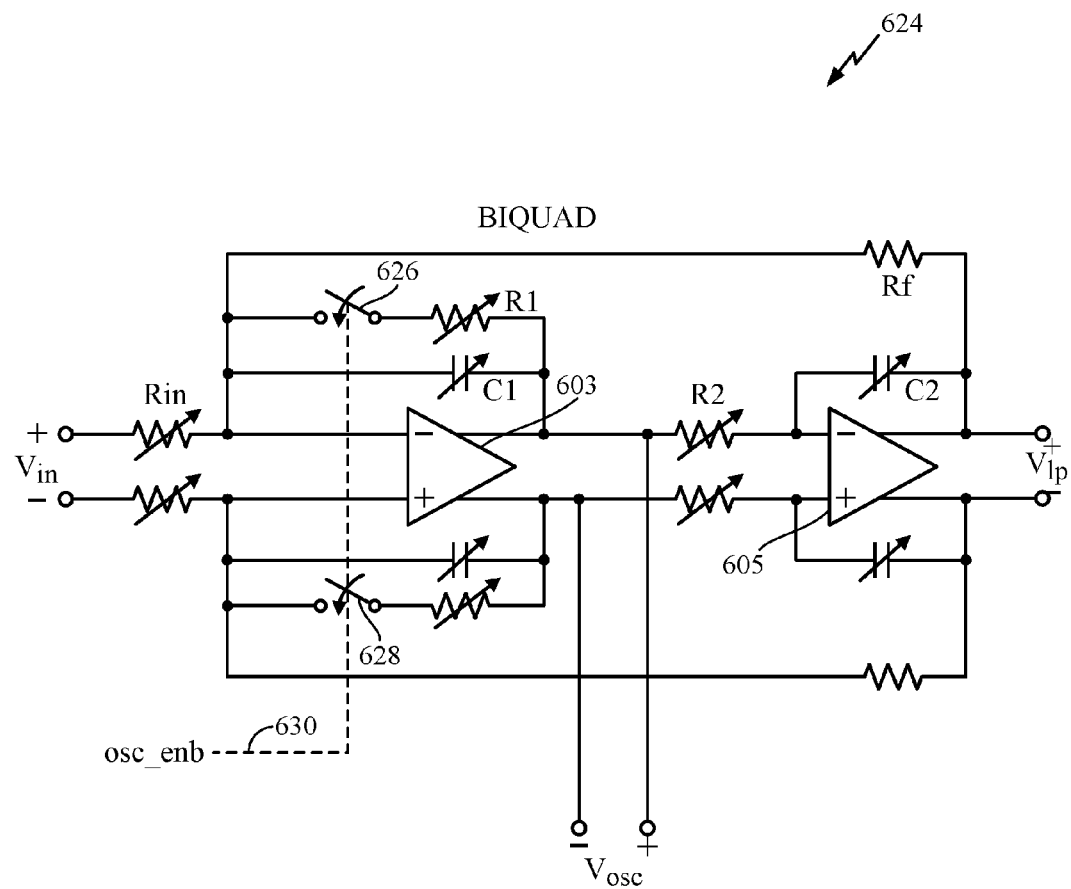
FIG. 6B is a schematic diagram of the biquad filter of FIG. 6A with oscillation switches added, in accordance with certain aspects of the present disclosure.

FIG. 6A is a schematic diagram of an example receive path 600 with a transimpedance amplifier (TIA) 602, a biquad filter 604, and a programmable gain amplifier (PGA) 606, in accordance with certain aspects of the present disclosure. The biquad filter 604 of FIG. 6A is a differential version of the single-ended biquad filter 400 of FIG. 4 and includes differential amplifiers 603 and 605. The biquad filter 604 may not include an inverter, as shown. A control signal 608 may be used to close switches 610 and send the bandpass output Vbp of the biquad filter 604 to the ADC (e.g., ADC 328). Alternatively, another control signal 612 may be used to close switches 614 and send the low-pass output Vlp of the biquad filter 604 to the PGA 606 for amplification before being digitized by the ADC. Although the TIA 602, the biquad filter 604, and the PGA 606 are implemented as differential circuits in FIG. 6, the receive path 600 may alternatively be implemented with single-ended circuits for certain aspects. Various components in the biquad filter 604 may be programmable. For example, Rin, R1, C1, R2, and/or C2 may be variable, as illustrated in FIG. 6A, such that the biquad filter 604 functions as a tunable active filter.

A tunable active filter with high Q (e.g., >1.5) and high center frequency ($f_0$) (e.g., >20 MHz) may be very sensitive to process, mismatch, and op amp imperfections. Calibrating each center frequency with high accuracy (e.g., 200 kHz) and Q for the filter provides a desired shaping of the frequency responses across the frequency range. One conventional methodology involves calibrating the filter with the help of a single tone generator (STG) and a fast Fourier transform (FFT) engine. The STG and FFT engine may sweep the frequency across the entire bandwidth with the accuracy desired and then tweak the filter parameter to reach the target center frequency. After reaching the center frequency, such systems may determine the −3 dB bandwidth again to determine the Q and thus tweak the filter parameter. This method can be very costly in terms of hardware area and cost, power consumption, and memory usage. Also, reaching the exact center frequency involves a large number of iterations and may be prone to error.

Certain aspects of the present disclosure provide techniques and apparatus for calibrating a tunable active filter without sweeping the frequency across the entire bandwidth and without determining a bandwidth (e.g., the −3 dB bandwidth) for each center frequency using a frequency sweep. Rather, to calibrate the various center frequencies and the Q for each $f_0$, the biquad filter is configured to oscillate during calibration. To enable this oscillation mode, oscillation enable switches 626, 628 may be added to the biquad filter 624 illustrated in FIG. 6B. When the oscillation enable (osc_enb) control signal 630 is de-asserted (e.g., logic low), the switches 626, 628 may be opened, thereby effectively disconnecting R1 from the feedback loop for the first integrator of the biquad filter 624 and causing the biquad filter to oscillate. The voltage of the oscillating signal (Vosc) may be sampled by the ADC by closing the switches 610 with the control signal 608.

Figure 7:
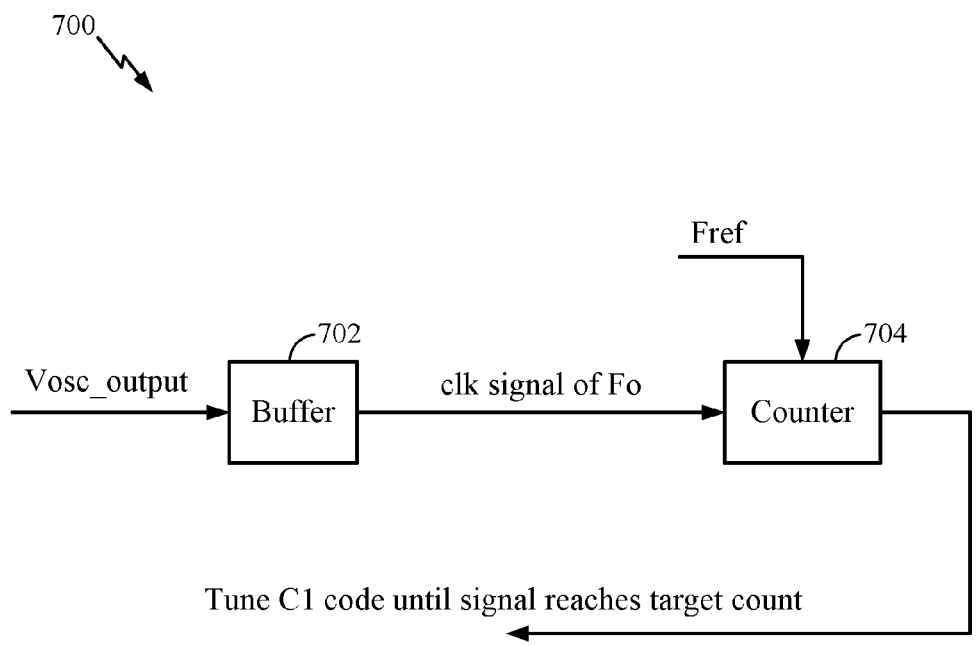
FIG. 7 is a block diagram of example digital logic for determining the frequency of an oscillating signal output by a tunable active filter to calibrate a variable capacitor in the tunable active filter, in accordance with certain aspects of the present disclosure.

The frequency of the sampled oscillating signal may be determined, and a value of a programmable component in the biquad filter (e.g., the capacitance of capacitor C1) may be adjusted until the sampled oscillating signal substantially equals the target center frequency. Any of various suitable techniques may be used to determine the frequency of the oscillating signal. For example, FIG. 7 illustrates example digital logic 700 for determining the frequency of the oscillating signal output by a tunable active filter to calibrate a variable capacitor (e.g., C1) in the tunable active filter, in accordance with certain aspects of the present disclosure. The digital logic 700 may be interfaced with the digitized output of the ADC, and may be incorporated in a digital signal processor (DSP), for example. The digital logic 700 may include a buffer 702 and a counter 704. The buffer 702 may receive the digitized oscillating signal and output a buffered version thereof. The buffered version of the oscillating signal may be input to the counter 704 and compared against a reference frequency signal. The reference frequency signal may be provided by a crystal oscillator, for example. The counter 704 may output a tuning code for the variable capacitor based on the actual count of the buffered version of the oscillating signal, such that the variable capacitor may be tuned to adjust the oscillating signal until the count for the buffered version of the oscillating signal reaches the target count corresponding to the target center frequency for the filter. In this manner, a center frequency may be calibrated, and this method may be repeated to calibrate other center frequencies using a different target center frequency.

Once the initial center frequency ($f_n$) has been calibrated by adjusting the programmable component in the tunable active filter, the Q associated with this center frequency may be initially tuned using an STG and an FFT engine to determine the bandwidth (e.g., the −3 dB bandwidth) for one of the center frequencies. The frequency sweep need not be performed for the entire frequency range of the tunable active filter; instead, the frequency sweep for the initial Q calibration may be performed for a relatively smaller frequency range that includes the initial center frequency. Furthermore, Q need not be tuned again using this method (i.e., involving the STG and the FFT engine) for the other center frequencies. The initially calibrated value of Q can be used to calculate the Q for other center frequencies, as illustrated in FIG. 8.

Figure 8:
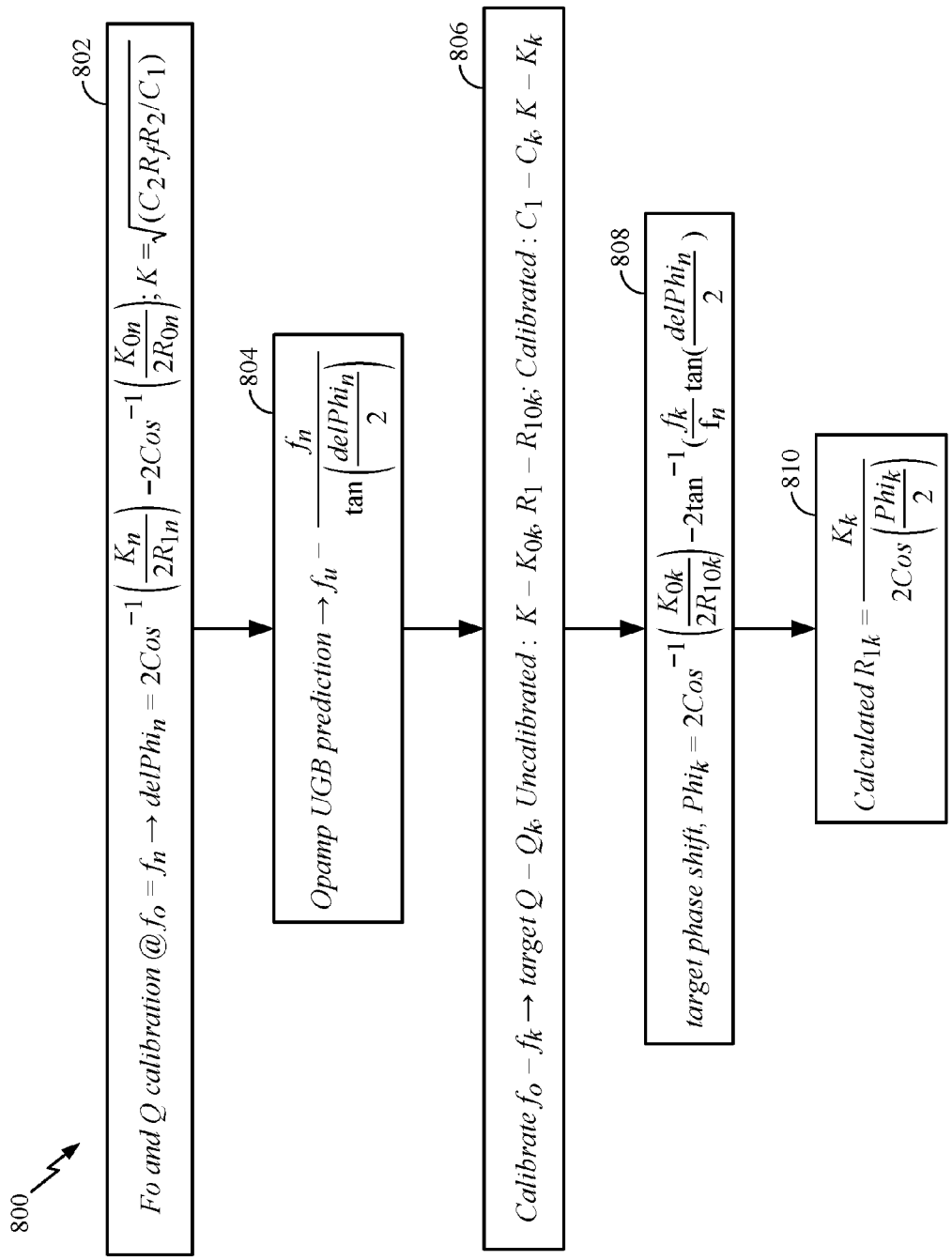
FIG. 8 is a flow diagram of example operations for calibrating a quality factor for a tunable active filter at different center frequencies, in accordance with certain aspects of the present disclosure.

FIG. 8 is a flow diagram of example operations 800 for calibrating the Q for a tunable active filter at different center frequencies based on a formula, in accordance with certain aspects of the present disclosure. More specifically, FIG. 8 illustrates how to determine the programmable resistance of resistor R1, which is proportional to Q as expressed above, for a target frequency ($f_k$) according to a target phase shift ($Phi_k$) and an op amp unity gain bandwidth (UGB) prediction corresponding to a given center frequency ($f_n$). The operations 800 may be performed by a circuit, which may include a tunable active filter and digital logic (e.g., a DSP).

The operations 800 may begin, at block 802, by calibrating the initial center frequency ($f_n$) and the initial quality factor (Q) as described above, by generating an oscillating signal with the biquad filter and adjusting the capacitance of programmable capacitor C1 until the oscillation frequency substantially matches the desired center frequency $F_0$. Then, after the initial Q is calibrated (e.g., using the STG and the FFT engine as described above), a phase shift ($delPhi_n$) associated with the initial $f_n$ and Q calibrations is calculated according to the following equation:

$$delPhi_n = 2\cos^{-1}\left(\frac{K_n}{2R_{1n}}\right) - 2\cos^{-1}\left(\frac{K_{0n}}{2R_{0n}}\right)$$

where $K=\sqrt{C_2 R_f R_2 / C_1}$ and is essentially the ratio of resistance $R_1$ to Q.

At block 804, the UGB of the op amp (e.g., amplifier 402 or amplifier 603) is predicted based on the initial center frequency and the phase shift calculated at block 802, according to the equation $$f_u = \frac{f_n}{\tan\left(\frac{delPhi_n}{2}\right)}$$

where $f_u$ is the unity gain frequency of the op amp.

At block 806, another center frequency ($f_k$) is selected for calibration with a target Q value ($Q_k$) and uncalibrated values of the ratio ($K=K_{0k}$) and programmable resistance ($R_1=R_{10k}$) as starting points. Programmable capacitor C1 may be calibrated as described above-based on adjustment of an oscillating signal from the biquad filter until the oscillation frequency equals the target center frequency—thereby yielding new calibrated values of programmable capacitance ($C_1=C_k$) and the ratio ($K=K_k$) associated with this center frequency ($f_k$).

At block 808, a target phase shift ($Phi_k$) for the center frequency ($f_k$) of interest is calculated for the op amp based on the predicted unity gain frequency ($f_u$) and the uncalibrated values of the ratio ($K=K_{0k}$) and programmable resistance ($R_1=R_{10k}$) according to the following equation:

$$Phi_k = 2\cos^{-1}\left(\frac{K_{0k}}{2R_{10k}}\right) - 2\tan^{-1}\left[\frac{f_k}{f_n}\tan\left(\frac{delPhi_n}{2}\right)\right]$$

At block 810, the calibrated value of the programmable resistance ($R_{1k}$) is calculated based on the calibrated value of the ratio ($K=K_k$) and the target phase shift ($Phi_k$), according to the following equation:

$$R_{1k} = \frac{K_k}{2\cos\left(\frac{Phi_k}{2}\right)}$$

In summary, after an initial center frequency and Q calibration, the op amp UGB is predicted. Then, a different center frequency is calibrated (e.g., C1 is adjusted), the phase shift at the op amp is predicted for this center frequency based on the UGB prediction, and this predicted phase shift is utilized to predict a tuning code to set for resistor R1. In this manner, the Q for the biquad filter may be calibrated once (e.g., at block 802). In other words, when another center frequency is selected other than the initially calibrated center frequency, the center frequency may be recalibrated, but the Q need not be recalibrated. Instead, information from the initial calibration is used to predict what the tuning code should be to obtain the desired Q at the different center frequency (e.g., repeat blocks 806, 808, and 810 for a given center frequency ($f_0=f_k$).

Figure 9:
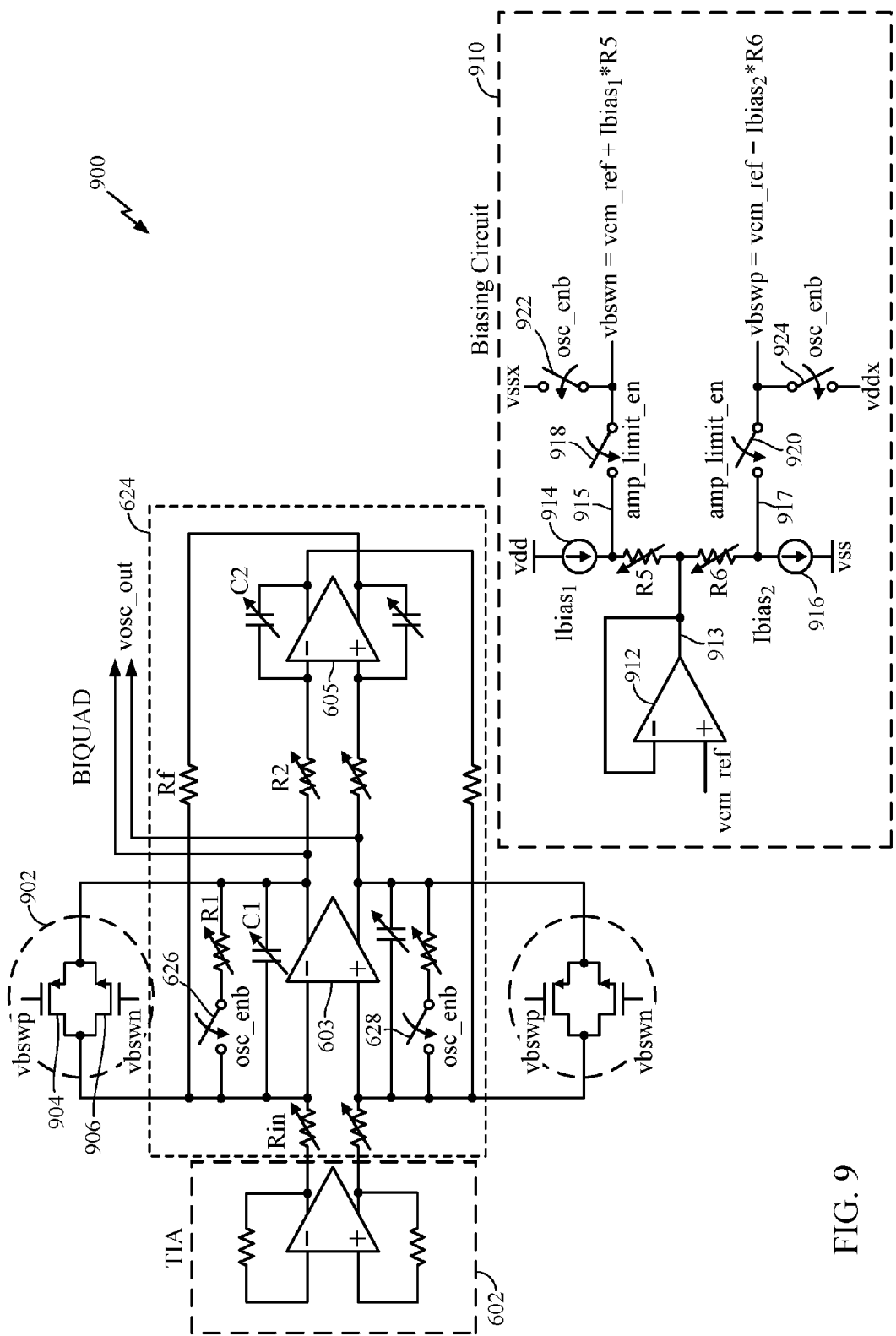
FIG. 9 is a schematic diagram of an example biquad filter with an amplitude limiter, in accordance with certain aspects of the present disclosure.

During calibration of the center frequency (e.g., at block 802 or block 806), the oscillating signal (Vosc) generated by the biquad filter may saturate the op amp (e.g., amplifier 603). If the op amp is saturated during calibration, the large signal center frequency may not match the actual small signal center frequency during normal operation of the biquad filter. To prevent op amp saturation and clipping of the oscillating signal, certain aspects of the present disclosure add an amplitude limiter 902 coupled to the biquad filter 624, as illustrated in the example filter circuit 900 of FIG. 9. Preventing clipping in this manner may provide more accurate calibration.

The amplitude limiter 902 may be connected in parallel with the feedback loop of the first integrator in the biquad filter 624 (e.g., in parallel with the capacitor C1 and the series combination of the resistor R1 and the switch 626 (or 628)). The amplitude limiter 902 may be implemented with two transistors connected in parallel. As illustrated, the amplitude limiter 902 may comprise a p-channel metal-oxide semiconductor (PMOS) transistor 904 connected drain-to-drain and source-to-source with an n-channel metal-oxide semiconductor (NMOS) transistor 906. A bias voltage for the gate of the PMOS transistor (vbswp) and a bias voltage for the gate of the NMOS transistor (vbswn) may be generated by a biasing circuit 910.

The biasing circuit 910 may include an operational amplifier 912 configured as a buffer (with the output 913 fed back to the negative input terminal). The positive input terminal of the amplifier 912 may be connected with a common-mode reference voltage (vcm_ref) of the filter circuit 900, such as the common-mode reference voltage of the biquad filter 624. The biasing circuit 910 may also include a current source 914 connected in series with a programmable resistor R5, which is in turn connected with the output 913 of the buffer. The current source 914 is configured to source a current $I_{bias,1}$ from the positive power supply rail (Vdd) through the programmable resistor R5 to generate the bias voltage vbswn at node 915 of the biasing circuit 910. Because the output 913 of the buffer has a voltage substantially equal to vcm_ref, the bias voltage vbswn is approximately equal to vcm_ref++$I_{bias,1}$*R5. Likewise, the output 913 of the buffer may be connected with a programmable resistor R6, which is connected in series with a current source 916. The current source 916 is configured to sink a current $I_{bias,2}$ through the programmable resistor R5 to the negative power supply rail (Vss) to generate the bias voltage vbswp at node 917 of the biasing circuit 910. Because the output 913 of the buffer has a voltage substantially equal to vcm_ref, the bias voltage vbswp is approximately equal to vcm_ref−$I_{bias,2}$*R6.

Amplitude-limiting enable switches 918, 920 may be controlled by a amplitude-limiting enable control signal (amp_limit_en), such that the bias voltages vbswn and vbswp at nodes 915 and 917, respectively, are connected with the gates of the respective transistors 906 and 904. The amplitude-limiting enable switches 918, 920 may be closed when amp_limit_en is asserted (e.g., logic high). When the switches 918, 920 are open, biasing switches 922, 924 may be closed to pull the gate of the NMOS transistor 906 down to a negative voltage (e.g., Vssx), such that the NMOS transistor 906 functions as an open switch, and to pull the gate of the PMOS transistor 904 up to a positive voltage (e.g., Vddx), such that the PMOS transistor 904 also behaves like an open switch, thereby effectively disabling the amplitude limiter 902. The control signal for biasing switches 922, 924 may be provided by the osc_enb control signal 630. In this case, when the oscillation mode is invoked for the biquad filter (by de-asserting osc_enb), the biasing switches 922, 924 are opened, allowing the amplitude limiter 902 to function (assuming amp_limit_en is asserted).

With certain aspects of the present disclosure, the center frequency of a high Q and high $f_0$ tunable active filter may be tuned very accurately. Based on initial calibration, the Q for other center frequencies can be accurately predicted. Certain aspects of the present disclosure do not require any additional hardware interruption for calibrating each center frequency and Q. The calibration can be performed in an online mode during power-up, which eliminates a large memory specification. Furthermore, the calibration according to certain aspects of the present disclosure does not involve any additional test equipment, so no error associated therewith is introduced.

Figure 10:
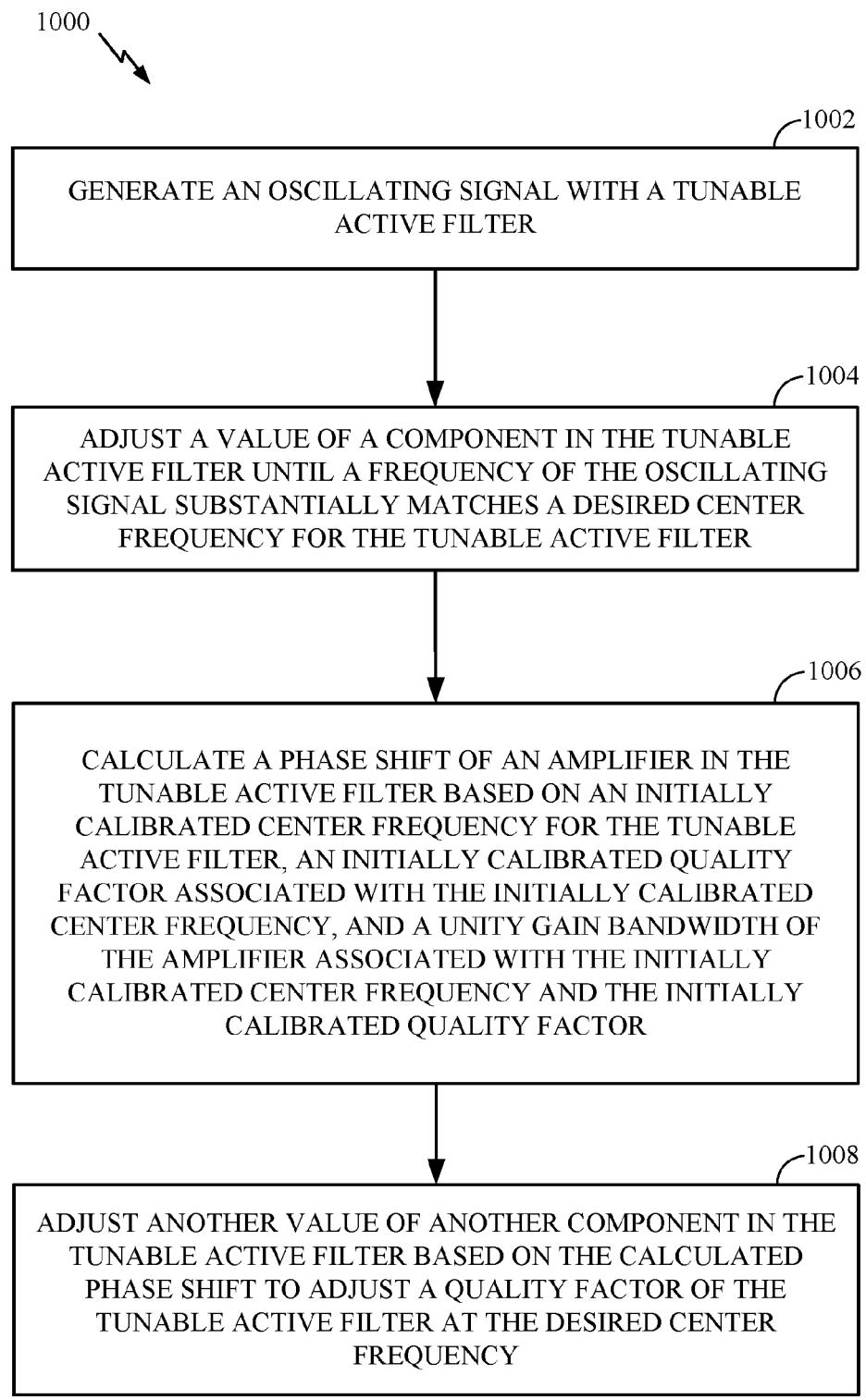
FIG. 10 is a flow diagram of example operations for calibrating a tunable active filter, in accordance with certain aspects of the present disclosure.

FIG. 10 is a flow diagram of example operations 1000 for calibrating a tunable active filter, in accordance with certain aspects of the present disclosure. The operations 1000 may be performed by a circuit, which may include a tunable active filter, digital hardware, and/or an amplitude limiter.

The operations 1000 may begin, at block 1002, with the tunable active filter generating an oscillating signal. At block 1004, a value of a component in the tunable active filter may be adjusted until a frequency of the oscillating signal substantially matches a desired center frequency for the tunable active filter. At block 1006, a phase shift of an amplifier in the tunable active filter may be calculated. This phase shift calculation may be based on an initially calibrated center frequency for the tunable active filter, an initially calibrated quality factor associated with the initially calibrated center frequency, and a unity gain bandwidth of the amplifier associated with the initially calibrated center frequency and the initially calibrated quality factor. At block 1008, another value of another component in the tunable active filter may be adjusted based on the calculated phase shift to adjust a quality factor of the tunable active filter at the desired center frequency.

According to certain aspects, the component comprises a programmable capacitor (e.g., C1), and the value of the component comprises a capacitance of the programmable capacitor. For certain aspects, the other component comprises a programmable resistor (e.g., R1), and the other value of the other component comprises a resistance of the programmable resistor.

According to certain aspects, generating the oscillating signal at block 1002 entails limiting the amplitude of the oscillating signal by enabling an amplitude limiter coupled to the tunable active filter.

According to certain aspects, generating the oscillating signal at block 1002 involves enabling an oscillation mode for the tunable active filter by opening at least one switch coupled between an input and an output of the amplifier.

According to certain aspects, the operations 1000 further include initially calibrating the quality factor associated with the initially calibrated center frequency. This initial calibration of the quality factor may include setting the tunable active filter to the initially calibrated center frequency; sweeping an input signal applied to the set tunable active filter over a range of frequencies; calculating the quality factor of the tunable active filter at the initially calibrated center frequency based on the sweep; and adjusting the other value of the other component in the tunable active filter based on the calculated quality factor and a desired quality factor at the initially calibrated center frequency to obtain the initially calibrated quality factor. For certain aspects, the operations 1000 further involve initially calibrating the center frequency. This initial calibration of the center frequency may include determining an initial center frequency for the tunable active filter for initial calibration, generating the oscillating signal with the tunable active filter, and adjusting the value of the component in the tunable active filter until the frequency of the oscillating signal substantially matches the initial center frequency.

According to certain aspects, the operations 1000 are performed during power-up of an apparatus comprising the tunable active filter.

According to certain aspects, the tunable active filter comprises a Tow-Thomas biquad filter.

According to certain aspects, the operations 1000 are performed before filtering an input signal applied to the tunable active filter set to the desired center frequency.

Figure 11:
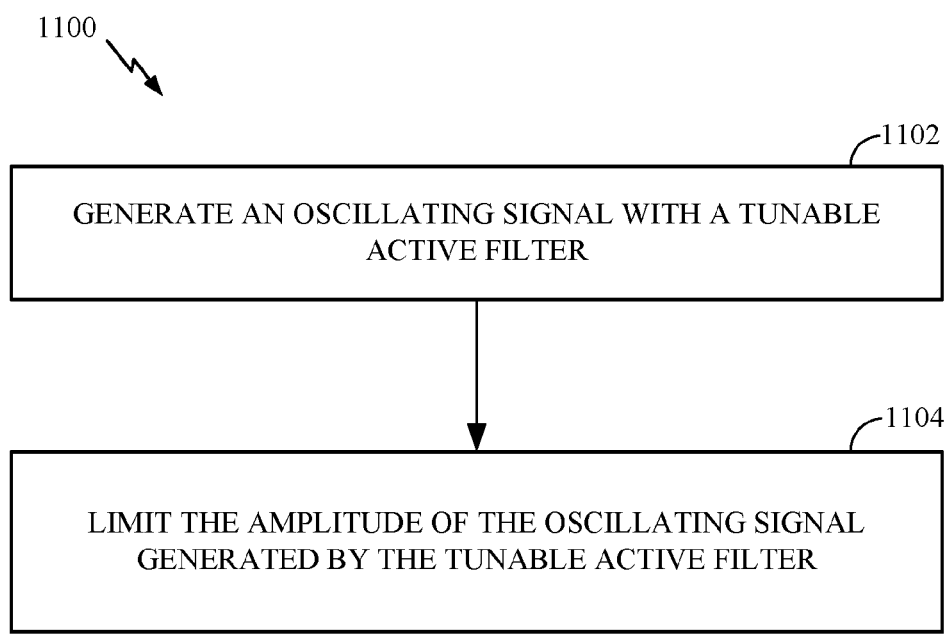
FIG. 11 is a flow diagram of example operations for calibrating a tunable active filter, in accordance with certain aspects of the present disclosure.

FIG. 11 is a flow diagram of example operations 1100 for calibrating a tunable active filter comprising at least one amplifier, in accordance with certain aspects of the present disclosure. The operations 1100 may be performed by a circuit, which may include a tunable active filter, an amplitude-limiting circuit (e.g., the amplitude limiter 902), and/or digital hardware.

The operations 1100 may begin, at block 1102, with the tunable active filter generating an oscillating signal. For certain aspects, the tunable active filter generates the oscillating signal by opening at least one first switch in a first feedback path coupled between an input and an output of the at least one amplifier. At block 1104, the circuit may limit the amplitude of the oscillating signal generated by the tunable active filter.

According to certain aspects, the limiting at block 1104 involves enabling an amplitude-limiting circuit coupled to the tunable active filter. For certain aspects, the amplitude-limiting circuit includes at least one transistor disposed in a second feedback path coupled between the input and the output of the least one amplifier. In this case, enabling the amplitude-limiting circuit may entail closing at least one second switch coupled between a biasing circuit and the at least one transistor disposed in the second feedback path. For certain aspects, enabling the amplitude-limiting circuit further includes opening at least one third switch coupled between the at least one transistor and at least one voltage rail. For certain aspects, the operations 1100 further involve generating at least one bias voltage with the biasing circuit. In this case, the at least one transistor of the amplitude-limiting circuit may include an n-channel metal-oxide semiconductor (NMOS) transistor and a p-channel metal-oxide semiconductor (PMOS) transistor. A drain of the NMOS transistor may be coupled to a drain of the PMOS transistor, a source of the NMOS transistor may be coupled to a source of the PMOS transistor, and the biasing circuit may be coupled to a gate of the NMOS transistor and to a gate of the PMOS transistor. In this case, generating the at least one bias voltage with the biasing circuit may involve generating a first bias voltage for biasing the gate of the NMOS transistor and/or generating a second bias voltage for biasing the gate of the PMOS transistor. For certain aspects, the operations 1100 may further entail buffering a common-mode voltage of the tunable active filter with a buffer circuit. In this case, generating the at least one bias voltage may include sourcing current through at least one resistive element coupled to an output of the buffer circuit.

According to certain aspects, the operations 1100 are performed during power-up of an apparatus (e.g., an access point 110 or a user terminal 120) comprising the tunable active filter.

According to certain aspects, the tunable active filter is a biquad filter (e.g., a Tow-Thomas biquad filter).

According to certain aspects, the operations 1100 further involve the circuit adjusting a value of a component in the tunable active filter until a frequency of the oscillating signal substantially matches a desired center frequency for the tunable active filter; calculating a phase shift of the amplifier in the tunable active filter based on an initially calibrated center frequency for the tunable active filter, an initially calibrated quality factor associated with the initially calibrated center frequency, and a unity gain bandwidth of the amplifier associated with the initially calibrated center frequency and the initially calibrated quality factor; and adjusting another value of another component in the tunable active filter based on the calculated phase shift to adjust a quality factor of the tunable active filter at the desired center frequency. For certain aspects, the component comprises a programmable capacitor, the value of the component comprises a capacitance of the programmable capacitor, the other component comprises a programmable resistor, and the other value of the other component comprises a resistance of the programmable resistor. For certain aspects, the operations 1100 further entail the circuit initially calibrating the quality factor associated with the initially calibrated center frequency by setting the tunable active filter to the initially calibrated center frequency, sweeping an input signal applied to the set tunable active filter over a range of frequencies, calculating the quality factor of the tunable active filter at the initially calibrated center frequency based on the sweep, and adjusting the other value of the other component in the tunable active filter based on the calculated quality factor and a desired quality factor at the initially calibrated center frequency to obtain the initially calibrated quality factor. For certain aspects, the operations 1100 further involve the circuit initially calibrating the center frequency by determining an initial center frequency for the tunable active filter for initial calibration, generating the oscillating signal with the tunable active filter, and adjusting the value of the component in the tunable active filter until the frequency of the oscillating signal substantially matches the initial center frequency.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A filter circuit comprising:
a tunable active filter comprising at least one amplifier and a first feedback path coupled between an input and an output of the at least one amplifier, the first feedback path comprising at least one switch and the tunable filter being configured to generate an oscillating signal when the at least one switch is open; and
an amplitude limiter coupled to the tunable active filter and comprising at least one transistor disposed in a second feedback path coupled between the input and the output of the at least one amplifier.

2. The filter circuit of claim 1, wherein the amplitude limiter is configured to limit the amplitude of the oscillating signal generated by the tunable active filter.

3. The filter circuit of claim 1, wherein the tunable active filter comprises a Tow-Thomas biquad filter.

4. The filter circuit of claim 1, wherein:
the at least one transistor of the amplitude limiter comprises an n-channel metal-oxide semiconductor (NMOS) transistor and a p-channel metal-oxide semiconductor (PMOS) transistor;
a drain of the NMOS transistor is coupled to a drain of the PMOS transistor; and
a source of the NMOS transistor is coupled to a source of the PMOS transistor.

5. The filter circuit of claim 4, wherein the amplitude limiter further comprises a biasing circuit coupled to a gate of the NMOS transistor and to a gate of the PMOS transistor, the biasing circuit being configured to generate a first bias voltage for biasing the gate of the NMOS transistor and a second bias voltage for biasing the gate of the PMOS transistor.

6. The filter circuit of claim 5, wherein the biasing circuit comprises:
a buffer circuit having an input configured to receive a common-mode voltage of the filter circuit;
a first current source and a first resistive element connected in series, coupled to an output of the buffer circuit, and configured to generate the first bias voltage; and
a second current source and a second resistive element connected in series, coupled to the output of the buffer circuit, and configured to generate the second bias voltage.

7. The filter circuit of claim 6, wherein at least one of the first resistive element or the second resistive element comprises a programmable resistor.

8. The filter circuit of claim 6, wherein the amplitude limiter further comprises:
a first switch coupled between the gate of the NMOS transistor and a first node between the first current source and the first resistive element, the first switch being configured to selectively couple the gate of the NMOS transistor to the first node to receive the first bias voltage; and
a second switch coupled between the gate of the PMOS transistor and a second node between the second current source and the second resistive element, the second switch being configured to selectively couple the gate of the PMOS transistor to the second node to receive the second bias voltage.

9. The filter circuit of claim 8, wherein the amplitude limiter further comprises:
a third switch coupled between the gate of the NMOS transistor and a first voltage rail and configured to selectively couple the gate of the NMOS transistor to the first voltage rail; and
a fourth switch coupled between the gate of the PMOS transistor and a second voltage rail and configured to selectively couple the gate of the PMOS transistor to the second voltage rail.

10. The filter circuit of claim 1, wherein the tunable active filter further comprises:
at least one programmable capacitor coupled between the input and the output of the at least one amplifier, the at least one programmable capacitor being configured to tune a center frequency of the filter circuit; and
at least one programmable resistor coupled between the input and the output of the at least one amplifier, the at least one programmable resistor being configured to tune a quality factor of the filter circuit.

11. The filter circuit of claim 10, wherein the at least one programmable resistor is connected in series with the at least one switch in the first feedback path.

12. The filter circuit of claim 10, wherein the at least one programmable capacitor is disposed in a third feedback path.

13. A filter circuit comprising:
a tunable active filter comprising at least one amplifier and a first feedback path coupled between an input and an output of the at least one amplifier, the first feedback path comprising at least one switch; and
an amplitude limiter coupled to the tunable active filter and comprising at least one transistor disposed in a second feedback path coupled between the input and the output of the at least one amplifier, wherein:
the tunable active filter comprises a differential tunable active filter having at least one differential amplifier with first and second inputs and first and second outputs;
the amplitude limiter comprises first and second amplitude-limiting circuits;
the first amplitude-limiting circuit is coupled between the first input and the first output of the at least one differential amplifier; and
the second amplitude-limiting circuit is coupled between the second input and the second output of the at least one differential amplifier.

14. A method for calibrating a tunable active filter comprising at least one amplifier, the method comprising:
generating an oscillating signal with the tunable active filter by opening at least one first switch in a first feedback path coupled between an input and an output of the at least one amplifier; and
limiting the amplitude of the oscillating signal generated by the tunable active filter by enabling an amplitude-limiting circuit coupled to the tunable active filter, the amplitude-limiting circuit comprising at least one transistor disposed in a second feedback path coupled between the input and the output of the least one amplifier.

15. The method of claim 14, wherein enabling the amplitude-limiting circuit comprises closing at least one second switch coupled between a biasing circuit and the at least one transistor disposed in the second feedback path.

16. The method of claim 15, wherein enabling the amplitude-limiting circuit further comprises opening at least one third switch coupled between the at least one transistor and at least one voltage rail.

17. The method of claim 15, further comprising generating at least one bias voltage with the biasing circuit.

18. The method of claim 17, wherein:
the at least one transistor of the amplitude-limiting circuit comprises an n-channel metal-oxide semiconductor (NMOS) transistor and a p-channel metal-oxide semiconductor (PMOS) transistor;
a drain of the NMOS transistor is coupled to a drain of the PMOS transistor;
a source of the NMOS transistor is coupled to a source of the PMOS transistor;
the biasing circuit is coupled to a gate of the NMOS transistor and to a gate of the PMOS transistor; and
generating the at least one bias voltage with the biasing circuit comprises:
generating a first bias voltage for biasing the gate of the NMOS transistor; and
generating a second bias voltage for biasing the gate of the PMOS transistor.

19. The method of claim 17, further comprising buffering a common-mode voltage of the tunable active filter with a buffer circuit, wherein generating the at least one bias voltage comprises sourcing current through at least one resistive element coupled to an output of the buffer circuit.

20. The method of claim 14, wherein the method is performed during power-up of an apparatus comprising the tunable active filter.

21. The method of claim 14, wherein the tunable active filter comprises a Tow-Thomas biquad filter.

* * * * *